United States Patent
Ohitsu et al.

(10) Patent No.: US 6,940,884 B2
(45) Date of Patent: Sep. 6, 2005

(54) SEMICONDUCTOR LASER DEVICE AND FABRICATING METHOD THEREOF

(75) Inventors: Yoshinori Ohitsu, Yamatokooriyama (JP); Keisuke Miyazaki, Ikoma (JP); Yoshihisa Fujii, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 228 days.

(21) Appl. No.: 10/417,268

(22) Filed: Apr. 17, 2003

(65) Prior Publication Data

US 2003/0206566 A1 Nov. 6, 2003

Related U.S. Application Data

(63) Continuation of application No. 09/651,106, filed on Aug. 30, 2000, now Pat. No. 6,618,415.

(30) Foreign Application Priority Data

| Aug. 31, 1999 | (JP) | ............................................ 11-244635 |
| Jun. 28, 2000 | (JP) | ........................................ 2000-194277 |

(51) Int. Cl.$^7$ .............................................. H01S 5/00
(52) U.S. Cl. ........................................... 372/46; 372/45
(58) Field of Search ..................................... 372/43–50

(56) References Cited

U.S. PATENT DOCUMENTS

| 5,020,067 | A | 5/1991 | Okada .......................... 372/46 |
| 5,297,158 | A | 3/1994 | Naitou et al. .................. 372/46 |
| 5,568,499 | A | 10/1996 | Lear ............................. 372/45 |
| 5,949,807 | A | 9/1999 | Fujimoto et al. .............. 372/45 |

FOREIGN PATENT DOCUMENTS

| JP | 5 167186 | 7/1993 | ............. H01S/3/18 |
| JP | 6-252497 | 9/1994 | |
| JP | 9-069667 | 3/1997 | ............. H01S/3/18 |
| JP | 2781097 B2 | 7/1998 | |
| JP | 10 335735 | 12/1998 | ............. H01S/3/18 |
| JP | 2885435 B2 | 4/1999 | |
| JP | 11 186665 | 7/1999 | |

OTHER PUBLICATIONS

U.S. Appl. No. 09/651,106 filed Aug. 30, 2000.

*Primary Examiner*—Quyen Leung
(74) *Attorney, Agent, or Firm*—Nixon & Vanderhye P.C.

(57) ABSTRACT

Provided is a semiconductor laser device in which at least an n-type first cladding layer, an active layer and a p-type second cladding layer are formed on or above an n-type semiconductor substrate. An n-type current block layer having a stripe-shaped groove-like removed portion is formed on the second cladding layer and at least a p-type third cladding layer is formed on the current block layer including the stripe-shaped removed portion. The second cladding layer has a p-type C impurity concentration of $3 \times 10^{17}$ cm$^{-3}$ to $2 \times 10^{18}$ cm$^{-3}$.

3 Claims, 9 Drawing Sheets

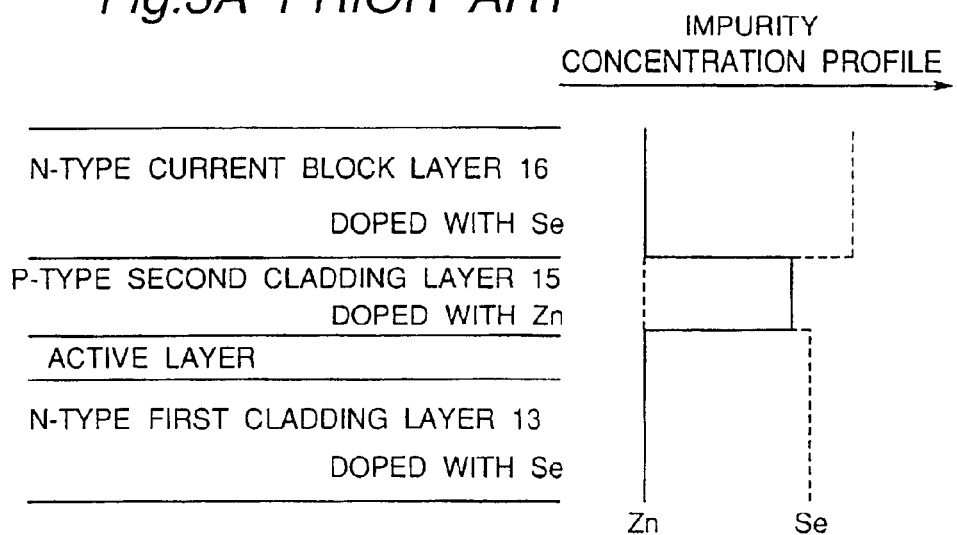
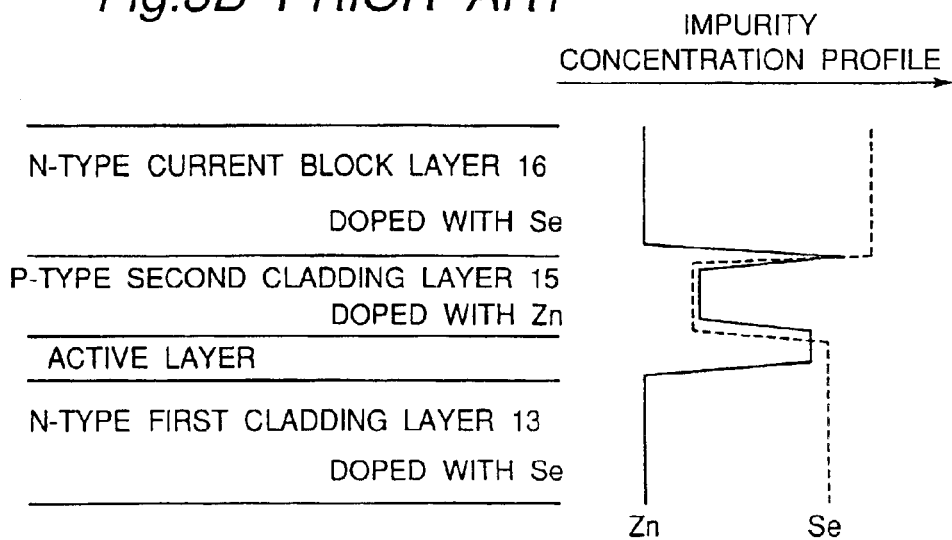

- 168 P-GaAs CAP LAYER
- 167 P-AlGaAs THIRD CLADDING LAYER
- 166 P-GaAs SUPPORTING LAYER
- 165 P-AlGaAs SECOND CLADDING LAYER
- 164 AlGaAs NON-DOPED QUANTUM WELL ACTIVE LAYER
- 163 N-AlGaAs FIRST CLADDING LAYER
- 162 N-GaAs BUFFER LAYER
- 160 N-GaAs SUBSTRATE

SEMICONDUCTOR LASER DEVICE AND FABRICATING METHOD THEREOF

This application is a continuation of U.S. patent application Ser. No. 09/651,106, filed Aug. 30, 2000 now U.S. Pat. No. 6,618,415, the disclosure of which is hereby incorporated herein by reference.

BACKGROUND OF THE INVENTION

The present invention relates to III–V compound semiconductor devices represented by semiconductor laser devices used as optical information system light sources for CD, MD and DVD players or computer information storage devices, and to a manufacturing method thereof. The present invention relates, in particular, to a structure for achieving a low threshold current operation, to a semiconductor device excellent in device characteristics, yield and reliability with improved controllability of impurities included in semiconductor layers, and to a manufacturing method thereof.

In recent years, there has been a growing demand for semiconductor laser devices that are compound semiconductor devices to be used for the pickups of CD and MD. Semiconductor laser devices that have little characteristic variations and excellent reliability have been demanded. Also, it is anticipated that the demand for semiconductor laser devices will be still more increasing in future for the production of the computer information storage devices such as CD-ROM, CD-R, CD-RW, and digital video discs (DVD).

When producing a III–V compound semiconductor device represented by such a semiconductor laser device, a stacked structure of a plurality of semiconductor layers is formed on a semiconductor substrate. By adding a specified impurity to each semiconductor layer, the electric conduction type or the electric conductivity of each layer is controlled to consequently obtain a device of specified semiconductor characteristics. To achieve uniform device characteristics of the semiconductor lasers and improvement in yield of products, it is very important to control the electric conduction type or the electric conductivity of each layer of the semiconductor device to be in conformity with designed values.

As a method of forming III–V compound semiconductor thin films in a stacked manner, the MOCVD (metal-organic chemical vapor deposition) method and the MBE (molecular beam epitaxy) method can be mentioned. When growing a film by using any of these methods, a group IV element such as silicon (Si) and a group VI element such as selenium (Se) are used as impurities for obtaining an n-type electric conduction type layer. The group IV element becomes a donor impurity by replacing a group III element of aluminum (Al), gallium (Ga), or indium (In). The group VI element becomes a donor impurity by replacing a group V element of arsenic (As) or phosphorus (P). On the other hand, as an impurity for obtaining a p-type electric conduction layer, a group II element such as zinc (Zn), beryllium (Be), or magnesium (Mg) is employed. The group II element becomes an acceptor impurity by replacing a group III element of Al or Ga.

Among semiconductor laser device structures, what we call a self-alignment structure and what we call a ridged structure are well known. FIGS. 4A, 4B and 4C show an example of a semiconductor laser device of the self-alignment structure. The fabricating process of this semiconductor laser device will be described below.

In the first process step shown in FIG. 4A, first, an n-type GaAs buffer layer 12 (layer thickness: 0.5 $\mu$m), an n-type $Al_xGa_{1-x}As$ first cladding layer 13 (x=0.5, layer thickness: 1.0 $\mu$m), a non-doped $Al_xGa_{1-x}As$ active layer 14 (x=0.14, layer thickness: 0.085 $\mu$m), a p-type $Al_xGa_{1-x}As$ second cladding layer 15 (x=0.5, layer thickness: 0.35 $\mu$m) and an n-type GaAs current block layer 16 (layer thickness: 0.6 $\mu$m) are successively grown on an n-type GaAs substrate 10 by the MOCVD method. In this stage, Se is employed as the n-type impurity, while Zn is employed as the p-type impurity. Next, in the second process step shown in FIG. 4B, an etching mask 40 is formed by a method such as photolithography. Thereafter, the n-type GaAs current block layer 16 is removed in a stripe-like and groove-like shape with a width of 3.5 to 4.0 $\mu$m, forming a removed portion 20.

Subsequently, in the third process step shown in FIG. 4C, a p-type $Al_xGa_{1-x}As$ third cladding layer 17 (x=0.5, layer thickness: 1.0 $\mu$m) and a p-type GaAs cap layer 18 (layer thickness: 3 to 50 $\mu$m) are grown on the n-type GaAs current block layer 16 including the removed portion 20 by the MOCVD method or the LPE method. In this case, the layer thickness of the p-type GaAs cap layer 18 should be determined as the occasion demands depending on where the final light emitting point of the semiconductor laser device is to be positioned relative to the chip thickness. Zn or Mg is employed then as the p-type impurity. By the aforementioned fabricating method, the semiconductor laser device of the self-alignment structure is obtained.

The molar ratio of the group V element to the group III element (V/III ratio) when forming a laminate by the MOCVD method in the first process step has conventionally been set to 20 to 150 at a growth temperature of 600° C. to 800° C. If the ratio is set to a value of 20 or lower, then there occurs a phenomenon of roughened growth surface. On the other hand, it has been reported that if the growth temperature is set to 450° C. to 600° C., then no roughness occurs on the crystal surface even when the V/III molar ratio is reduced to 0.3 to 2.5, and that the intake of carbon C to the grown thin film is increased so that a p-type hole density of $1\times10^{18}$ $cm^{-3}$ to $1\times10^{20}$ $cm^{-3}$ by the carbon C of GaAs and AlGaAs is obtained (JP-B2-2885435).

In a practically used semiconductor laser device of the structure shown in FIG. 4C, in the first process step for forming at least the n-type first cladding layer 13, the active layer 14, the second cladding layer 15 and the n-type current block layer 16 on the n-type GaAs substrate, the n-type first cladding layer 13 and the n-type current block layer 16 are doped with an impurity of Se, and the p-type second cladding layer 15 is doped with an impurity of Zn However, in the structure after the completion of the first process step, the impurity elements move or migrate between the layers by diffusion or the interaction of the impurity atoms during the fabricating process, which results in an impurity profile different from a designed impurity profile. FIG. 3A shows the designed impurity concentration profile, in which, of course, the n-type first cladding layer 13 and the n-type current block layer 16 are designed to be doped with the n-type impurity of Se, and the p-type second cladding layer 15 is designed to be doped with the p-type impurity of Zn, each with a steep doping slope. FIG. 3B shows an actual impurity concentration profile. As obvious from this figure, the impurity of Zn in the p-type second cladding layer 15 diffuses into the layers other than the p-type second cladding layer 15 during the growth of the n-type current block layer 16 in the first process step, as a consequence of which the doping control of the p-type second cladding layer 15 becomes unstable.

Further, in the third process step after the formation of the stripe removed portion 20 in the n-type current block layer 16 in the second process step, due to a thermal history during the process for growing the p-type third cladding layer 17 and the p-type GaAs cap layer 18 at the removed portion of the current block layer 16 and the non-removed portion of the current block layer, the impurity of Zn in the p-type second cladding layer 15 increasingly diffuses into the other layers and, in certain circumstances, the impurity of Se of the n-type first cladding layer 13 and the n-type current block layer 16 diffuses into the p-type second cladding layer 15. The diffusion of n-type impurity surpasses the concentration of the p-type impurity of Zn of the p-AlGaAs cladding layer 15, consequently causing the inversion of the p-type second cladding layer 15 into the n-type. This inversion into the n-type, which occurs either on the entire surface of the p-type second cladding layer 15 or in the portion that faces the non-removed portion of the n-type current block layer 16, disables the local current injection for obtaining the laser oscillation of the semiconductor laser device, causing a defective product.

Also, in the ridged-structure semiconductor laser device as well, Zn has been employed as the impurity added to the p-type cladding layer to be formed on an active layer constructed of a quantum well layer. Therefore, similar to the semiconductor laser device of the self-alignment structure, Zn disadvantageously diffuses into the active layer during the fabricating process. This causes the disorder of the entire quantum well active layer, eventually changing the oscillation wavelength. The diffusion otherwise causes the degradation in crystallinity of the quantum well active layer, disadvantageously increasing the threshold current and the operating current. This has resulted in degradation in laser characteristics and an increase in characteristic variations.

SUMMARY OF THE INVENTION

Accordingly, an object of the present invention is to provide a fabricating method capable of doping a p-type cladding layer, in particular, a p-type cladding layer formed in the vicinity of the active layer in conformity with the designed impurity concentration and with good controllability, and also provide a semiconductor laser device structure formed by the method.

There is provided, according to an aspect of the invention, a semiconductor laser device in which at least an n-type first cladding layer, an active layer, and a p-type second cladding layer are stacked on or above an n-type semiconductor substrate, wherein the second cladding layer contains carbon as a p-type impurity at a concentration of $2\times10^{17}$ cm$^{-3}$ to $2\times10^{18}$ cm$^{-3}$.

Carbon is an impurity that diffuses very little. Therefore, the electric conduction type of the p-type second cladding layer is prevented from being inverted to the n-type. Thus, the semiconductor laser device of the present invention is allowed to have an impurity concentration profile almost as designed.

In one embodiment, an n-type current block layer having a stripe-shaped groove is provided on or above the second cladding layer, at least a p-type third cladding layer is formed on the current block layer including the stripe-shaped groove, and the carbon concentration of the second cladding layer is $3\times10^{17}$ cm$^{-3}$ to $2\times10^{18}$ cm$^{-3}$. This semiconductor laser device is of what we call a self-alignment structure.

To fabricate this semiconductor laser device, it is possible to use a method comprising:

a first process step of successively forming at least a first cladding layer, an active layer, a second cladding layer, and a current block layer on or above a semiconductor substrate, wherein a growth condition for the second cladding layer is such that the second cladding layer has carbon serving as a p-type impurity at a concentration of $3\times10^{17}$ cm$^{-3}$ to $2\times10^{18}$ cm$^{-3}$;

a second process step of forming a stripe-shaped groove in the current block layer; and a third process step of forming at least a third cladding layer on the current block layer including the stripe-shaped groove.

This fabricating method makes it hard for the impurity to diffuse from the second cladding layer into other layers and vice versa during the growth of the n-type current block layer in the first process step and during the formation of at least the third cladding layer in the third process step. Therefore, the electric conduction type of the p-type second cladding layer can be prevented from being inverted to the n-type.

The third process step may comprise diffusing an impurity from the third cladding layer into the second cladding layer via the groove of the current block layer such that the impurity concentration of the second cladding layer is higher in a region that faces the groove of the current block layer than in the remaining regions.

In the thus-obtained semiconductor laser device, the second cladding layer has a lower resistance in its higher impurity concentration portion which faces a removed portion, i.e., the stripe-shaped groove of the current block layer than in its lower impurity concentration portions that are the remaining regions of the second cladding layer. Therefore, a current that reaches the higher impurity concentration portion of the second cladding layer is prevented from diffusing into the lower impurity concentration portions. Therefore, according to the present invention, a wattless current, which would otherwise occur due to the current diffusion inside the second cladding layer, is prevented from occurring. This, a low threshold current and a low current drive operation are achievable.

In one embodiment, in the first process step, a metal-organic chemical vapor deposition method is used, and the growth condition for the p-type second cladding layer is that a molar ratio of a group V source to a group III source (V/III ratio) is 20 to 50. With this arrangement, the possible occurrence of surface roughness of the grown crystal can be avoided, and the carbon (C) concentration becomes $3\times10^{17}$ cm$^{-3}$ to $2\times10^{18}$ cm$^{-3}$. Use of this fabricating method enables, with controllability and reproducibility superior to those in the conventional case, the p-type second cladding layer to have an impurity concentration that causes no inversion of the electric conduction type.

In the third process step, liquid phase epitaxy (LPE) can be used instead. In this case, adjusting the temperature and time of the LPE growth achieves diffusion of an optimum quantity of impurity into the second cladding layer that faces the removed portion of the current block layer. If the light emitting position of the semiconductor laser device is required to be a central position with respect to the final chip thickness of, for example, 100 $\mu$m, then the cap layer on the third cladding layer must be grown to a thickness of 50 $\mu$m in the third process step. The LPE method achieves this in a short time and at low cost.

By using magnesium (Mg) as a p-type impurity for the third cladding layer in the third process step using the LPE method, diffusion of an optimum quality of impurity into the second cladding layer that faces the removed portion of the current block layer can be easily performed.

In the comparison between the semiconductor laser device having undergone the LPE in the third process to diffuse Mg and the semiconductor laser device having undergone the MOCVD in the third process to diffuse no impurity, the threshold current of the latter was 42 mA, which was 7 mA greater than that of the former. In addition, the former had a drive voltage of 1.88 V at the optical output power of 5 mW, while the latter had a drive voltage of 1.95 V, meaning that the latter had a larger device resistance than the former. This fact proved the superiority of the structure in which the impurity concentration of the second cladding layer in the region that faces the groove is made higher than the impurity concentration of the second cladding layer in the remaining regions.

According to the present invention, carbon, which diffuses very little, is used for the second cladding layer. Therefore, even if the n-type impurity of Se is used in growing n-type semiconductor layers on the substrate, the diffusion of the impurity of Se from the first cladding layer and the current block layer into the second cladding layer can be effectively prevented.

In another embodiment, the active layer comprises a quantum well layer or layers, and the semiconductor laser device further comprises a ridge-shaped p-type third cladding layer and an n-type current block layer which are provided on or above the second cladding layer in a manner that the third cladding layer extends in a stripe-like shape and that the n-type current block layer holds the third cladding layer from laterally opposite sides thereof. This semiconductor layer device is of what we call a ridged structure.

In order to fabricate this ridged-structure semiconductor laser device, it is possible to use a fabricating method comprising:

a first process step of successively forming at least a first cladding layer, a quantum well active layer, a second cladding layer, and a third cladding-layer on or above a semiconductor substrate, wherein a growth condition used for the second cladding layer is such that the second cladding layer has carbon serving as a p-type impurity at a concentration of $2 \times 10^{17}$ cm$^{-3}$ to $2 \times 10^{18}$ cm$^{-3}$;

a second process step of processing the third cladding layer into a shape of ridge extending like a stripe; and a third process step of forming an n-type current block layer on the ridge-shaped second cladding layer in such a manner as to sandwich the ridge-shaped third cladding layer in the current block layer.

By using this fabricating method, the impurity in the p-type second cladding layer can be prevented from diffusing into the quantum well active layer.

In one embodiment, in the first process step, a metal-organic chemical vapor deposition method is used and the growth condition for the p-type second cladding layer is that a molar ratio of a group V source to a group III source (V/III ratio) is 10 to 50. With this arrangement, the possible occurrence of the surface roughness of the grown crystal can be avoided, and at the same time, the second cladding layer achieves a carbon (C) concentration of $2 \times 10^{17}$ cm$^{-3}$ to $2 \times 10^{18}$ cm$^{-3}$. Use of this fabricating method enables, with controllability and reproducibility superior to those in the conventional case, the p-type second cladding layer to have an impurity concentration that causes no inversion of the electric conduction type.

In the first process step for fabricating the ridged-structure semiconductor laser device, carbon may be employed as a p-type impurity for the third cladding layer, and a growth condition for the third cladding layer may be such that a carbon concentration of the third cladding layer is $2 \times 10^{17}$ cm$^{-3}$ or higher. In this case, the impurity in the p-type third cladding layer is prevented from diffusing into the p-type second cladding layer and the active layer. Thus, the diffusion of the impurity into the active layer is more effectively prevented. In this case, the molar ratio of the group V source to the group III source (V/III ratio) should preferably be set to 10 to 50 as a growth condition of the third cladding layer. With this arrangement, the occurrence of the surface roughness of the grown crystal can be avoided, and also, the third cladding layer can contain carbon (C) at the concentration of $2 \times 10^{17}$ cm$^{-3}$ or higher. This fabricating method enables, with controllability and reproducibility superior to those in the conventional case, the p-type third cladding layer to have an impurity concentration that causes no inversion of the electric conduction type.

The ridged-structure semiconductor laser device fabricating method may comprise, between the first and second process steps, a fourth process step of disordering the active layer in a light-emitting end surface portion of the semiconductor laser device through heat treatment to thereby form a window region.

As described above, according to the present invention, the p-type second cladding layer (and also the p-type third cladding layer in one embodiment) is doped with the impurity of carbon that diffuses very little. This arrangement can prevent the diffusion of the impurity from the p-type second cladding layer (also from the p-type third cladding layer in one embodiment) into the quantum well active layer, which will easily occur if the cladding layer is doped with an impurity of Zn instead, in this fourth process step. That is, the active layer is prevented from being disordered in the region (oscillation region) other than the window region.

The semiconductor laser device fabricated through this fourth process step has a window region in the light-emitting end surface portion, the window region having a band gap greater than that of the oscillation region. As described above, the disorder in the oscillation region of the active layer is suppressed, and therefore, the end surface window effect in this semiconductor laser device is great enough to allow the output power to be increased.

The fourth process step may include:

partially forming an SiO$_2$ film or an SiN film on a wafer obtained through the first process step; and thermally treating the wafer formed with the SiO$_2$ film or the SiN film to disorder a portion of the active layer just below the SiO$_2$ film or the SiN film.

When fabricating the semiconductor laser device having any one of the aforementioned structures, the p-type compound semiconductor layers can be formed of AlGaAs.

As is obvious from the above, the present invention can improve the yield of semiconductor laser devices and provides a semiconductor laser device having sufficient capabilities that is not inferior to the prior art products in terms of characteristics.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3A shows a structure in cross-section and a designed impurity profile of a conventional semiconductor laser device;

FIG. 3B shows a structure in cross-section and an actual impurity profile of a conventional semiconductor laser device;

DETAILED DESCRIPTION OF THE PREFERRED EMBODIMENTS

An exemplary semiconductor laser device structure and an exemplary device fabrication process using a metal-organic chemical vapor deposition (MOCVD) method will be described below.

Figure 5:
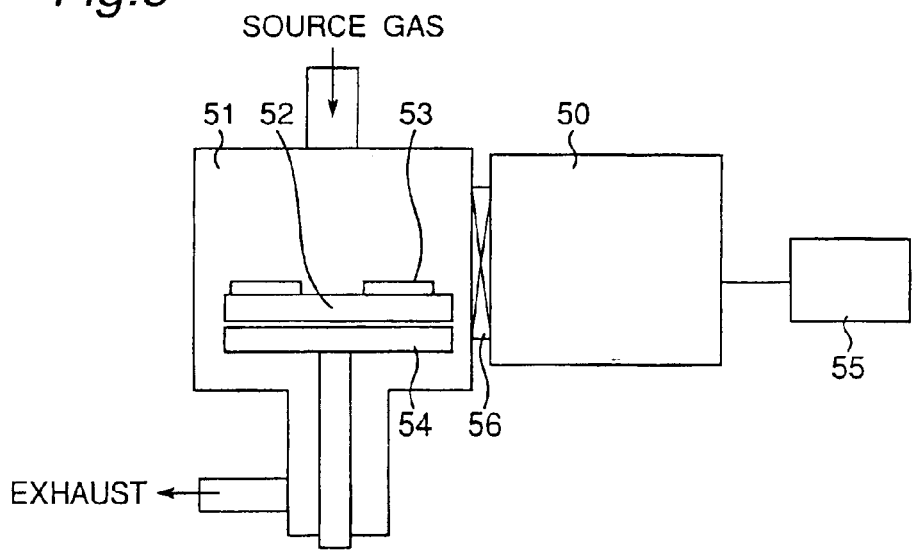
FIG. 5 is a schematic view of a metal-organic CVD system.

FIG. 5 shows a schematic view of a MOCVD system.

Referring to FIG. 5, a sample introduction chamber 50 is separated from a growth chamber 51 by a gate valve 56. The sample introduction chamber 50 is equipped with a vacuum pump 55 such as a turbo molecular pump so as to allow the atmospheric pressure to be reduced to a high vacuum in a short time. When fabricating a semiconductor laser device by this apparatus, semiconductor substrates 53 are set on a wafer holder 52 made of molybdenum or carbon in the sample introduction chamber 50. Subsequently, a high vacuum is created in the sample introduction chamber 50 by the vacuum pump 55, and the wafer holder 52 is introduced into the growth chamber 51. Subsequently, the substrate temperature is raised by a heater 54, and when a temperature of about 300° C. is reached, $AsH_3$ is supplied to the chamber for the prevention of evaporation of arsenic (As).

<First Embodiment>

Figure 6:
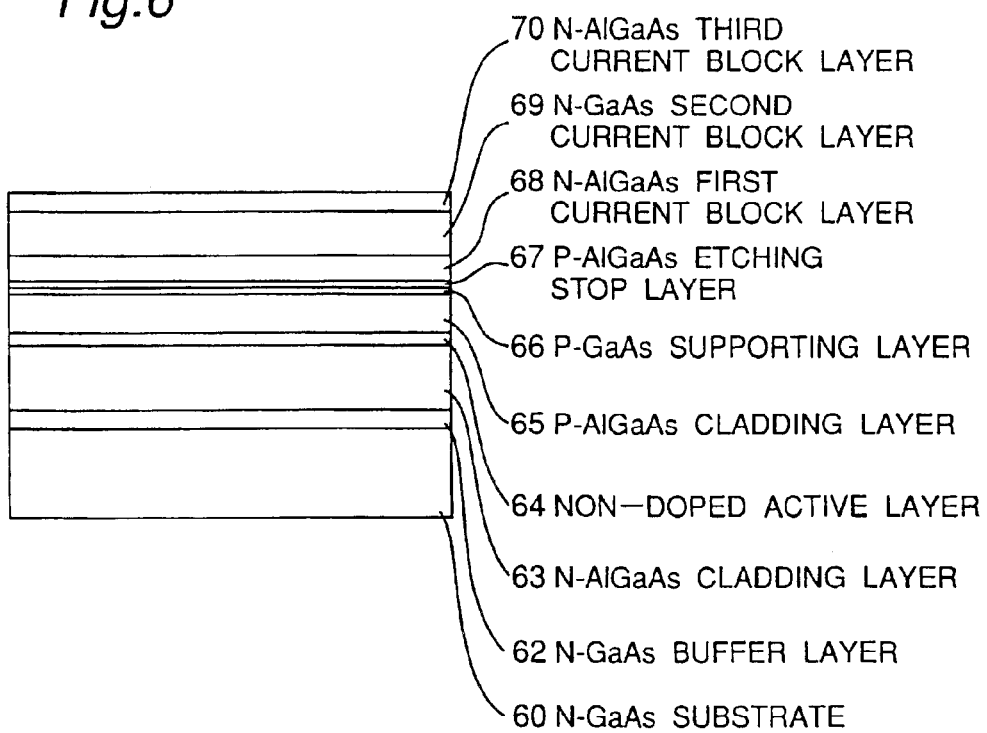
FIGS. 6, 7 and 8 show process steps for fabricating a semiconductor laser device according to a first embodiment of the present invention.

A method for fabricating a semiconductor laser device having a self-alignment structure will be described first. In this example, an n-GaAs substrate 60 was employed as the semiconductor substrate 53 shown in FIG. 5. After the substrate temperature reached 700° C. to 750° C., an n-GaAs buffer layer (layer thickness: 0.5 μm, carrier concentration: $1 \times 10^{18}$ cm$^{-3}$) 62, an n-Al$_x$Ga$_{1-x}$As first cladding layer (x=0.5, layer thickness: 1.0 μm, carrier concentration: $8 \times 10^{17}$ cm$^{-3}$) 63, an Al$_x$Ga$_{1-x}$As non-doped active layer (x=0.14, layer thickness: 0.085 μm) 64, a p-Al$_x$Ga$_{1-x}$As second cladding layer (x=0.5, layer thickness: 0.35 μm) 65, a p-GaAs supporting layer (layer thickness: 0.003 μm) 66, a p-Al$_x$Ga$_{1-x}$As etching stop layer (x=0.7, layer thickness: 0.02 μm) 67, an n-Al$_x$Ga$_{1-x}$As first current block layer (x=0.1, layer thickness: 0.1 μm, carrier concentration: $2 \times 10^{18}$ cm$^{-3}$) 68, an n-GaAs second current block layer (layer thickness: 0.4 μm, carrier concentration: $2 \times 10^{18}$ cm$^{-3}$) 69 and an n-Al$_x$Ga$_{1-x}$As third current block layer (x=0.1, layer thickness: 0.1 μm, carrier concentration: $2 \times 10^{18}$ cm$^{-3}$) 70 are successively formed in this order on the n-GaAs substrate 60, as shown in FIG. 6. In this case, the p-AlGaAs second cladding layer 65, the p-GaAs supporting layer 66 and the p-AlGaAs etching stop layer 67 were grown under the condition that a molar ratio between the group V source and the group III source (V/III ratio) was 30 in contrast to the molar ratio of 60 of the other layers. As a p-type impurity, carbon (C) derived from the alkylated substances of trimethyl gallium (TMG) and trimethyl aluminum (TMA), which are sources of the group III elements of Ga and Al, was employed, and the carrier concentration of the p-AlGaAs cladding layer 65 was set to $4 \times 10^{17}$ cm$^{-3}$. Selenium (Se) was used as an impurity for the n-GaAs buffer layer, the n-AlGaAs cladding layer, the n-GaAs second current block layer and the n-AlGaAs first and third current block layers, and $H_2Se$ gas was used as the Se source.

Figure 2:
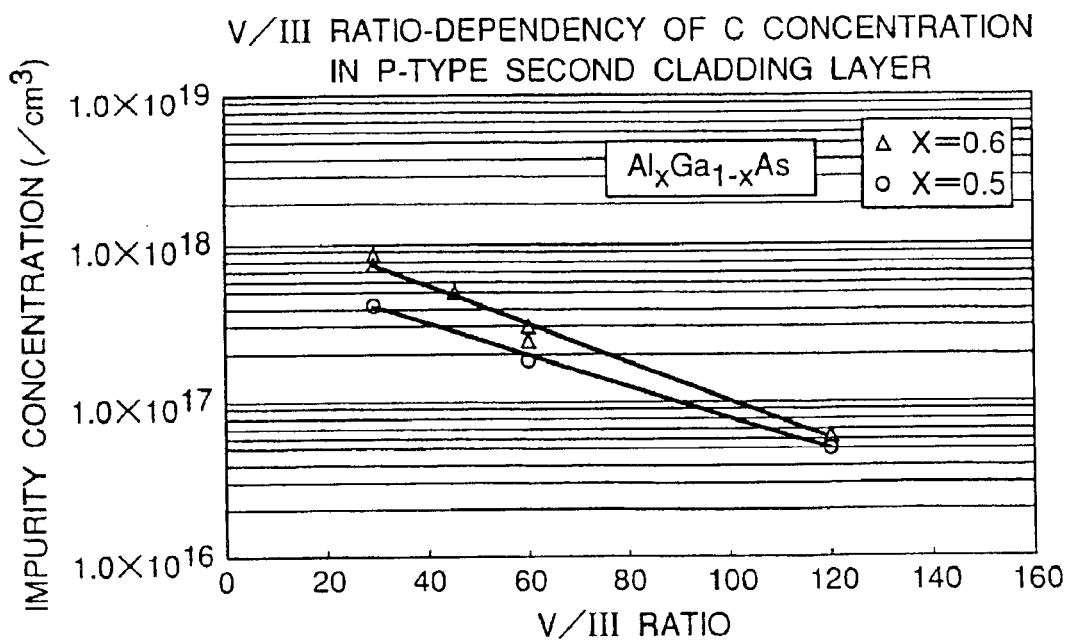
FIG. 2 is a graph showing the V/III ratio-dependency of the C concentration of the present invention.
Figure 4A:
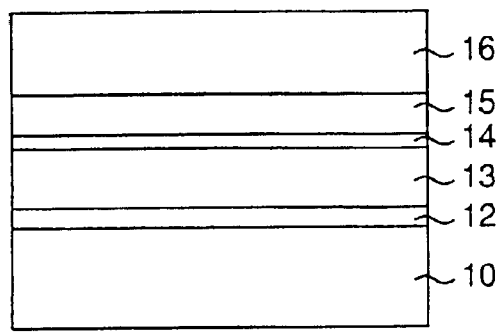
FIGS. 4A, 4B and 4C show process steps for fabricating a semiconductor laser device.
Figure 4B:
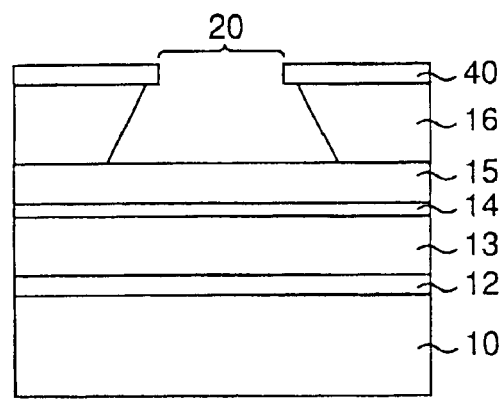
Figure 4C:
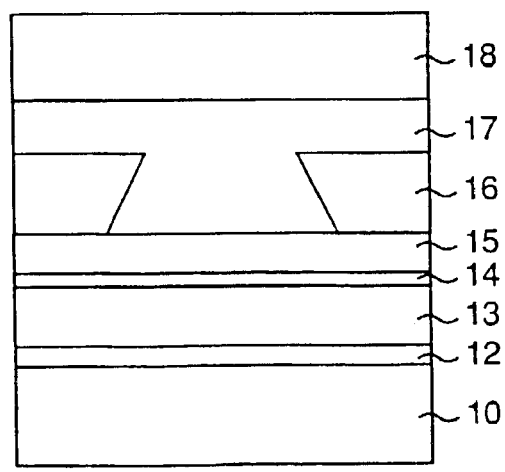

The data of the aforementioned V/III molar ratio and the C impurity concentration are shown in FIG. 2. When Al$_x$Ga$_{1-x}$As (X=0.5) is grown at a temperature of 750° C. by the MOCVD method, a p-type background impurity concentration ascribed to C of the alkylated substances of TMG and TMA increases as the V/III molar ratio decreases. However, if the V/III molar ratio is decreased to 20 or less, then roughness disadvantageously occurs on the crystal growth surface. Therefore, conventionally, the V/III molar ratio has been set to 60 to 120. As described above, zinc (Zn), which has conventionally been employed as a p-type impurity, has had the problem that it diffuses into the layers other than the intended layer after obtaining a thermal history in the growth phase and the subsequent regrowth phase. Accordingly, in this embodiment, the V/III molar ratio was set to 20 or more at which no roughness occurs on the crystal growth surface, and carbon, which diffuses very little even after the obtainment of the thermal history, was employed. It is, of course, acceptable to provide a separate carbon source, without using carbon of the alkylated substances.

Figure 7:
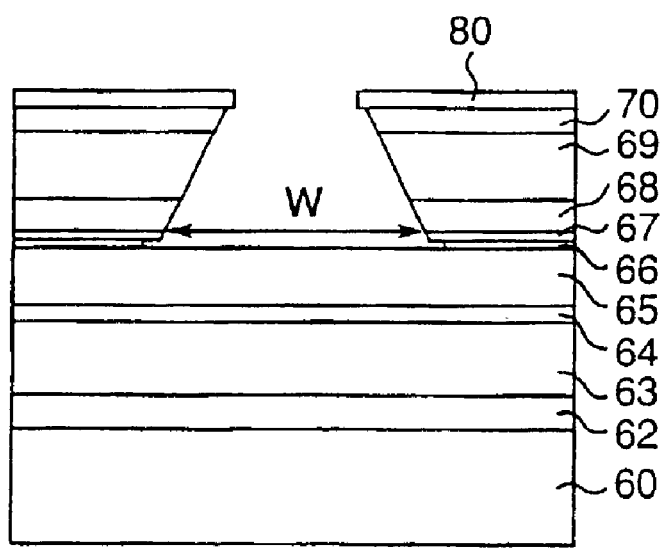

Subsequently, photolithography is performed as shown in FIG. 7 to form a stripe-shaped etching mask 80, and thereafter the n-type first, second and third current block layers 68, 69 and 70 are etched by an ammonia-based etchant. In this stage, by using an etchant having no etching rate or very little etching rate with respect to the p-AlGaAs etching stop layer 67, the n-type current block layers 68, 69 and 70 were selectively etched. The etching was performed until a stripe width W became 4.0 μm. Further, the p-AlGaAs etching stop layer 67 within the stripe was etched by hydrofluoric acid, and then the etching mask 80 was removed by an organic solvent.

Figure 8:
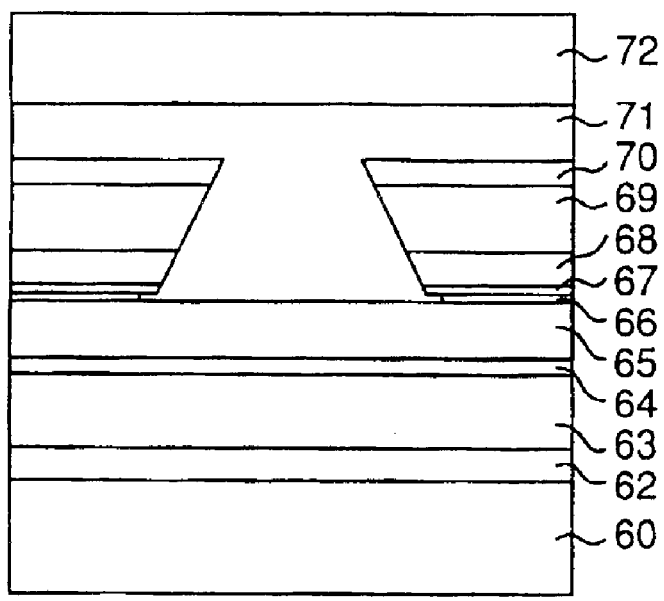

Next, a p-Al$_x$Ga$_{1-x}$As third cladding layer (x=0.5, layer thickness: 1.0 μm, carrier concentration: $2 \times 10^{18}$ cm$^{-3}$) 71 and a p-GaAs cap layer (layer thickness: 50.0 μm, carrier concentration: $6 \times 10^{18}$ cm$^{-3}$) 72 were regrown by LPE (FIG. 8). In this LPE process, due to the existence of the p-GaAs supporting layer 66 exposed at the bottom of the stripe, sufficient regrowth can be achieved. In order to dissolve prescribed quantities of As and Al in a Ga solution and once put the same into a saturated state, a hold time of 100 minutes at a temperature of 800° C. was provided before performing the LPE growth. If an entire n-type current block layer is provided by a single GaAs layer, then end portions of the etched block layer defining the stripe-shaped groove will suffer shape change ascribed to the escape of arsenic (As) due to a high temperature. The escaped arsenic may gather in opposite corners of the stripe-shaped groove, which will disadvantageously change the designed stripe width in some instances. Accordingly, by forming upper and lower parts of the current block layer from n-$Al_xGa_{1-x}As$ layers (x=0.1, layer thickness: 0.1 μm) 68 and 70 as described above, the regrowth of the layers 71, 72 was achieved with the etched shape retained. Magnesium (Mg) was used as an impurity for the p-AlGaAs cladding layer 71 and p-GaAs cap layer 72 grown by LPE. As a result of diffusion of Mg, the p-AlGaAs cladding layer 65, which initially had a carrier concentration of $4\times10^{17}$ $cm^{-3}$ of C, came to have a carrier concentration of $1\times10^{18}$ $cm^{-3}$ in a portion within a stripe, namely, in a portion below the stripe-shaped groove. This allows a current to be efficiently injected into the stripe and enables the achievement of the low threshold value and the low-current drive of the semiconductor laser device.

This third process for regrowth can also be performed by the MOCVD method. In an example, Zn was used as an impurity. To reduce the growth time, the layer thickness of the p-GaAs cap layer 72 was set to 3 μm. The growth temperature was set to 700° C. In this case, no diffusion into the stripe of the p-AlGaAs second cladding layer 65 occurs. Accordingly, in the first process step shown in FIG. 6, the growth conditions for the p-AlGaAs second cladding layer 65 were set on the basis of the data shown in FIG. 2 so that the V/III molar ratio was 20, that the carrier concentration was $7\times10^{17}$ $cm^{-3}$, and that the layer thickness was 0.25 μm. The MOCVD regrowth process does not locally increase the impurity concentration of the p-AlGaAs second cladding layer 65, unlike the LPE regrowth process. Thus, the impurity (C) concentration of the p-AlGaAs cladding layer 65 was almost doubled. In order to suppress the possible wattless current, the layer thickness was reduced. Even when the regrowth is performed by MOCVD instead of LPE, a semiconductor laser device having similar capability is obtained.

The substrate surface of the wafer after completion of the regrowth in the third process step was removed by abrasion or etching to make the wafer thickness 100 μm. Thereafter, the thus obtained wafer was provided with an electrode on each of its n-side and p-side surfaces. Then, the wafer was cleaved into bar-like segments in a direction perpendicular to the stripe-shaped groove formed inside the wafer, and opposite light-emitting surfaces were coated with an insulating film. In this way, a semiconductor laser device was completed.

Figure 1:
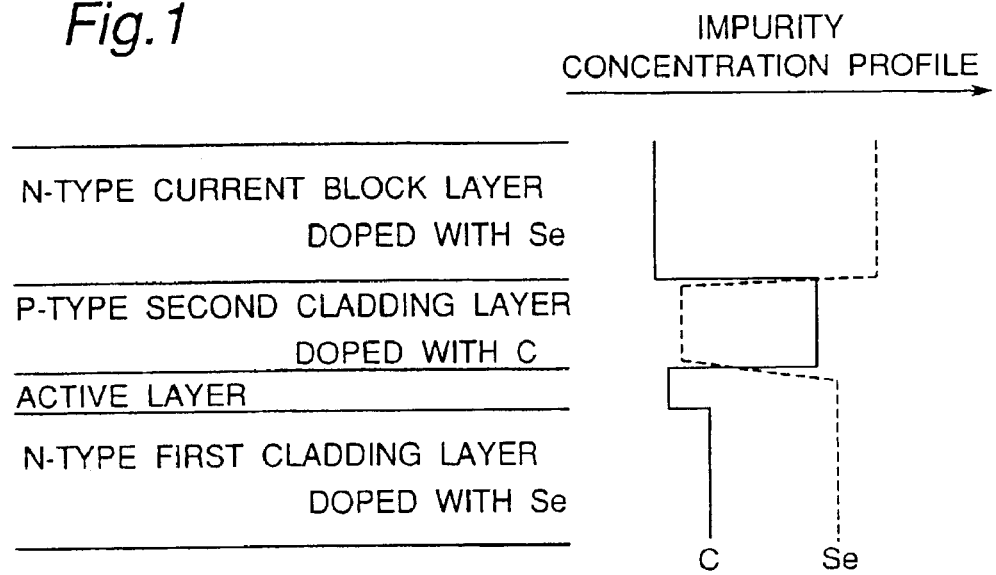
FIG. 1 schematically shows a structure in cross-section and an impurity profile of a semiconductor laser device of the present invention.

FIG. 1 shows the impurity concentration profile of the semiconductor laser device of the first embodiment. This figure indicates that the electric conduction type of the second cladding layer is satisfactorily kept at the p-type, meaning that the impurity concentration profile almost conforming to the design (see FIG. 3A) was obtained.

The semiconductor laser device of the above structure formed by this fabricating method has obtained the following ideal numerical values: with a cavity length set at 250 μm, a oscillation threshold value of 35 mA, a drive current of 50 mA at an optical output power of 5 mW, an oscillation wavelength of 785 nm, and optical characteristics of 38° in the direction vertical to the direction of junction, and 10° in the horizontal direction relative to the junction direction.

With regard to the coherence, which serves to determine noise characteristics, a satisfactory value of 0.3 was obtained. This means that a semiconductor laser device of a lower threshold value and a lower drive current can be supplied by further reducing the thickness of the p-AlGaAs cladding layer or shortening the cavity length. Furthermore, the defect of the inversion of the p-AlGaAs cladding layer to the n-type electric conduction type, which had occurred about once in every 20 times of layer growth before, was eliminated.

Next, evaluation was conducted on semiconductor laser devices in which the cavity length was set to 200 μm and the p-AlGaAs cladding layer 65, the p-GaAs supporting layer 66 and the p-AlGaAs etching stop layer 67 were grown at the V/III molar ratios of 10, 20, 30 and 60. Table 1 shows the drive currents Iop of the devices at an optical output power of 5 mW.

TABLE 1

| V/III Ratio | Iop (mA) Device NO. | | | | |
|---|---|---|---|---|---|
| | 1 | 2 | 3 | 4 | 5 |
| 10 | 60.7 | 61.0 | 61.5 | 57.6 | 58.9 |
| 20 | 40.3 | 43.7 | 40.4 | 42.7 | 41.8 |
| 30 | 40.7 | 40.9 | 40.9 | 40.9 | 40.3 |
| 60 | 44.0 | 42.4 | 44.3 | 45.0 | 42.3 |

Figure 9:
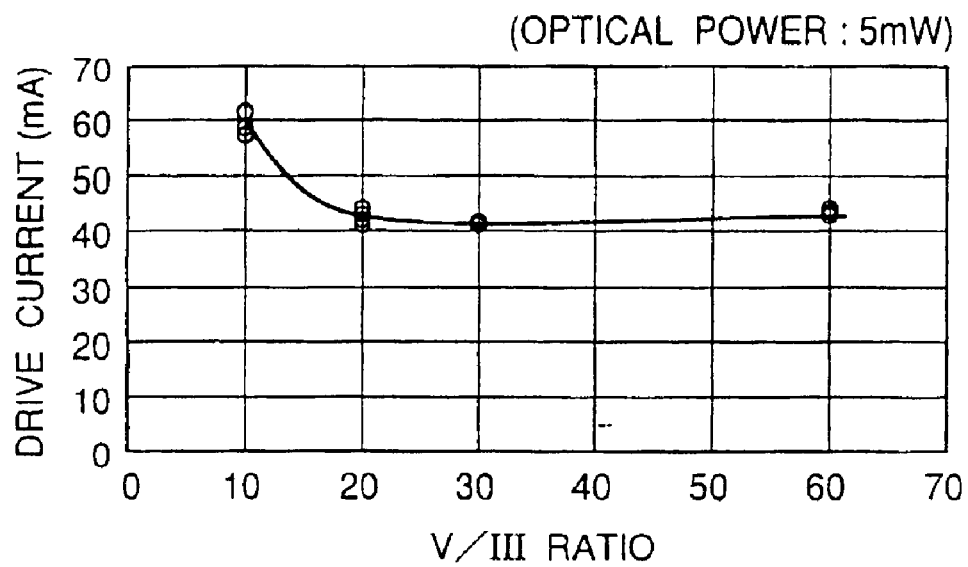
FIG. 9 is a graph showing a correlation between a V/III ratio and a drive current at an optical output power of 5 mW.

In the case of the V/III ratio of 10, the semiconductor laser has displayed an oscillation threshold value of 45 mA and a drive current Iop of about 60 mA in average at an optical output of 5 mW, as is apparent from Table 1. Also, it has been observed that both the oscillation threshold value and the drive current tend to increase, as compared with the values obtained at the V/III ratio of 20 to 60. FIG. 9 shows a correlation between the V/III ratio and the drive current Iop (mA) at the optical output power of 5 mW.

In the case of the V/III ratio of 10, in some devices, a drive current value Iop increased 1.2 or more times the initial value within 48 hours in an aging test conducted at a device temperature of 80° C. and at an optical output power of 7 mW. This indicates that the reliability was degraded.

Figure 10:
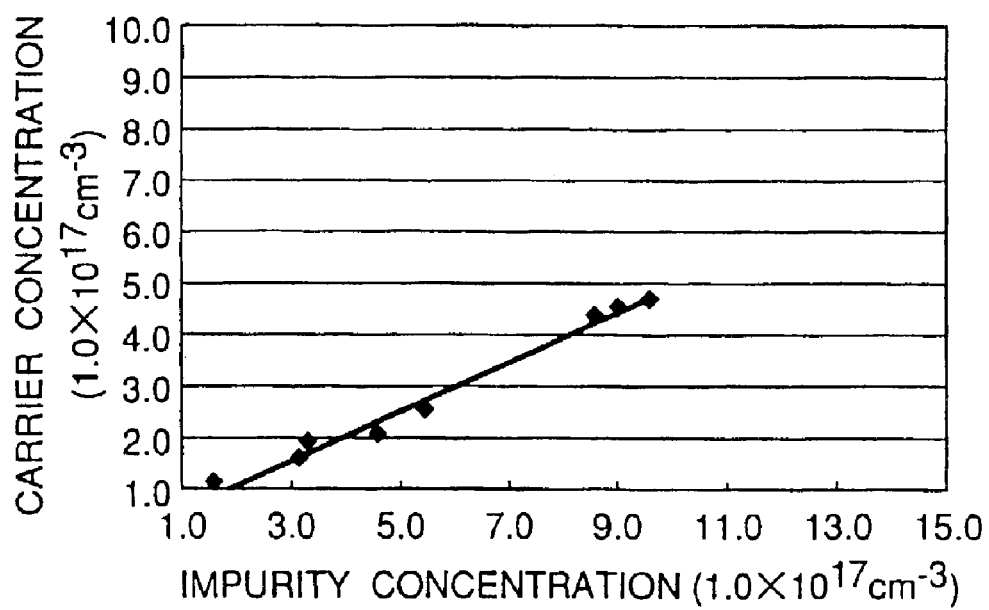
FIG. 10 is a graph showing a correlation between an impurity concentration and a carrier concentration.

For the V/III ratio of 60, the concentration of the impurity of C sometimes becomes $3.0\times10^{17}$ $cm^{-3}$ or less according to FIG. 2, and the carrier concentration sometimes becomes $2.0\times10^{17}$ $cm^{-3}$ or less according to FIG. 10. For this reason, the defect of the inversion of the electric conduction type of the p-AlGaAs cladding layer 65 to the n-type occurred once in every five times of growth, and some devices did not oscillate.

As is obvious from the above discussion, the impurity concentration of $3\times10^{17}$ $cm^{-3}$ to $2\times10^{18}$ $cm^{-3}$ was realized with the V/III ratio set to 20 to 50, and semiconductor laser devices having excellent characteristics and reliability were obtained.

<Second Embodiment>

Figure 13:
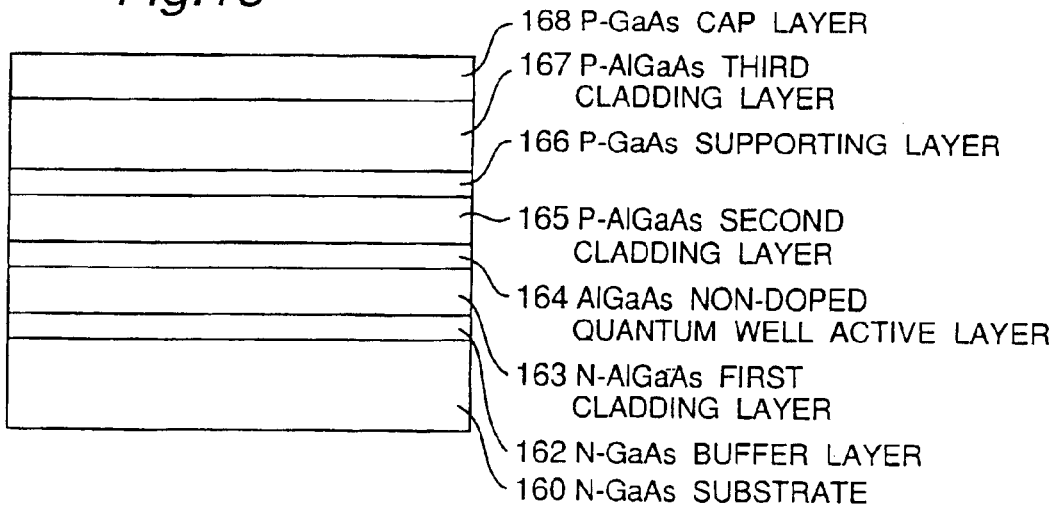
FIGS. 13, 14, 15, and 16 show process steps for fabricating a semiconductor laser device according to a second embodiment of the present invention.

An example of the fabrication of a semiconductor laser device having a ridged structure will be described next with reference to FIGS. 13 through 16. In this example, an n-GaAs substrate 160 was employed as the semiconductor substrate 53 shown in FIG. 5. After the substrate temperature reached a temperature of 700° C. to 750° C., an n-GaAs buffer layer (layer thickness: 0.5 μm, carrier concentration: $1\times10^{18}$ $cm^{-3}$) 162, an n-$Al_xGa_{1-x}As$ first cladding layer (x=0.5, layer thickness: 2.7 μm, carrier concentration:

$8\times10^{17}$ cm$^{-3}$) 163, an Al$_x$Ga$_{1-x}$As non-doped quantum well active layer 164, a p-Al$_x$Ga$_{1-x}$As second cladding layer (x=0.5, layer thickness: 0.18 μm) 165, a p-GaAs supporting layer (layer thickness: 0.003 μm) 166, a p-Al$_x$Ga$_{1-x}$As third cladding layer (x=0.5, layer thickness: 1.4 μm) 167 and a p-GaAs cap layer (layer thickness: 0.6 μm) 168 are successively formed in this order on the n-GaAs substrate 160, as shown in FIG. 13. In this case, the p-AlGaAs second cladding layer 165 was grown under the condition that the molar ratio of the group V source and the group III source (V/III ratio) was set to 20 in contrast to the molar ratio of 60 of the other layers. As a p-type impurity, carbon (C) derived from the alkylated substances of TMG and TMA, which are sources of the group III elements of Ga and Al, was employed. In this stage, the impurity concentration (C concentration) of the p-AlGaAs second cladding layer 165 was $8\times10^{17}$ cm$^{-3}$. Zinc (Zn) was used as a p-type impurity for the p-AlGaAs third cladding layer 167. Also, as an impurity for the n-GaAs buffer layer 162 and the n-AlGaAs first cladding layer 163, silicon (Si) was used, and H$_2$Se gas was used as the Si source.

Figure 12:
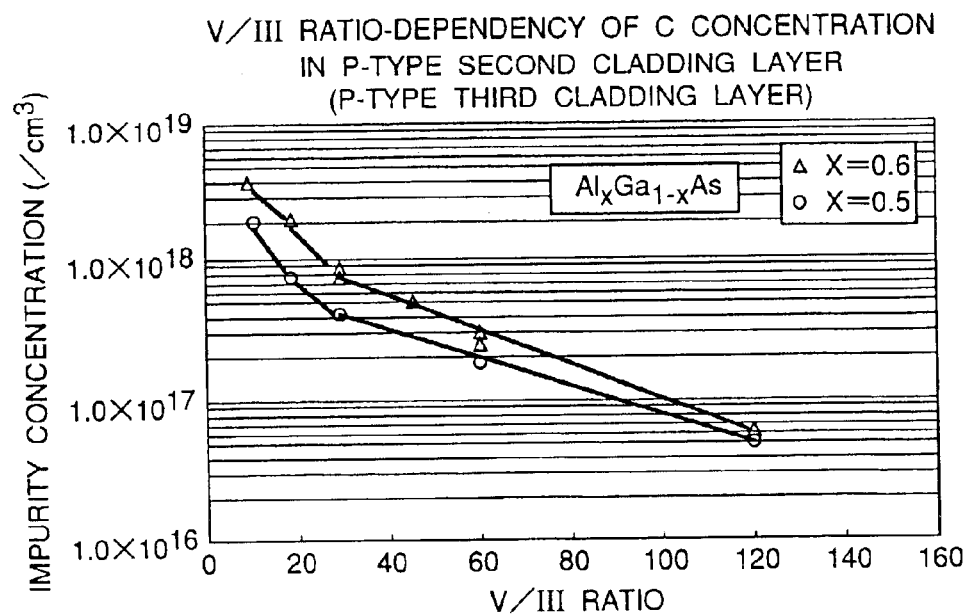
FIG. 12 is a graph of the V/III ratio-dependency of C carrier concentration according to the present invention.

The data of the aforementioned V/III molar ratio and the C impurity concentration are shown in FIG. 12. When Al$_x$Ga$_{1-x}$As (X=0.5) is grown at a temperature of 750° C. by the MOCVD method, a p-type background impurity concentration ascribed to C of the alkylated substances of TMG and TMA increases as the V/III molar ratio decreases. However, if the V/III molar ratio is decreased to 10 or less, then roughness disadvantageously occurs on the crystal growth surface. Therefore, conventionally, the V/III molar ratio has been set to 60 to 120. As described above, zinc (Zn), which has conventionally been employed as a p-type impurity, has had the problem that it diffuses into the layers other than the intended layer after obtaining a thermal history in the growth phase and the subsequent regrowth phase. Accordingly, in this embodiment, the V/III molar ratio was set to 10 or more at which no roughness occurs on the crystal growth surface, and carbon, which diffuses very little even after the obtainment of the thermal history, was employed. It is, of course, acceptable to provide a separate carbon source, without using carbon of the alkylated substances.

Figure 14:
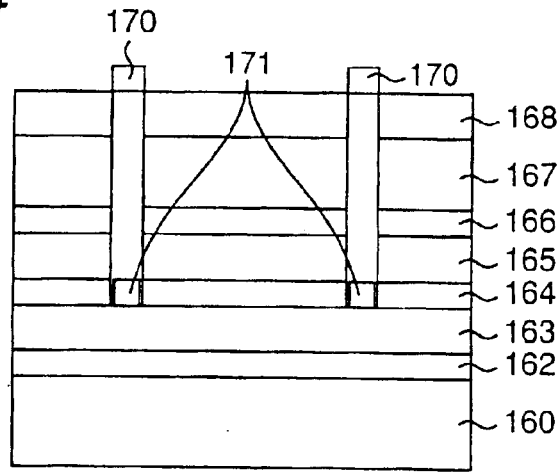

Subsequently, an SiO$_2$ film was formed on the entire surface of the cap layer 168 by the P-CVD (plasma CVD) method. Then, by performing photolithography and etching by hydrofluoric acid, stripe-shaped SiO$_2$ films or SiO$_2$ stripes 170 (width: 40 μm, pitch: 800 μm) were formed, as shown in FIG. 14, in positions which would serve as light-emitting end surface portions later. Subsequently, by performing heat treatment at a temperature of 900° C. for 10 minutes by the RTA (Rapid Thermal Annealing) method, portions of the quantum well active layer 164 located just below the SiO$_2$ stripes 170 were disordered to form end surface window regions 171. In this stage, an SiN film may be employed in place of the SiO$_2$ film.

Figure 15:
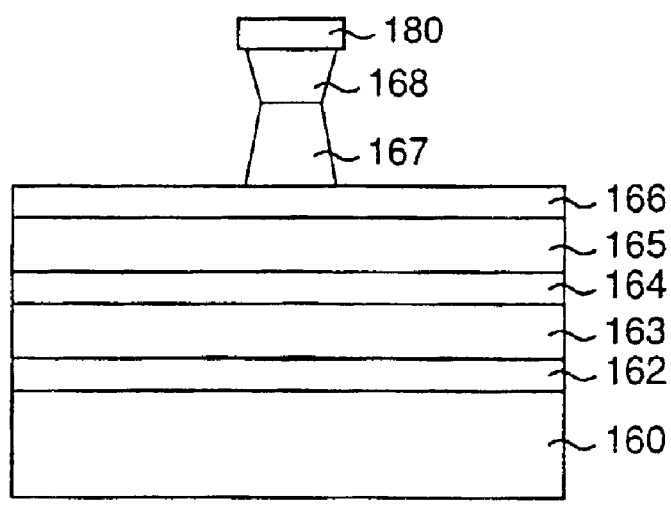

Subsequently, the SiO$_2$ stripes 170 were removed, and a stripe-shaped etching mask 180 is formed perpendicularly to the end surface window regions 171, as shown in FIG. 15. Then, the p-GaAs cap layer 168 and the p-AlGaAs third cladding layer 167 were etched by a sulfuric acid-based etchant. In this stage, the p-AlGaAs third cladding layer 167 was etched until part of the layer of a layer thickness of 0.2 μm was left. Next, the remaining third cladding layer 167 was etched by hydrofluoric acid. Thus, a stripe-shaped ridge constructed of the third cladding layer 167 was formed.

Figure 16:
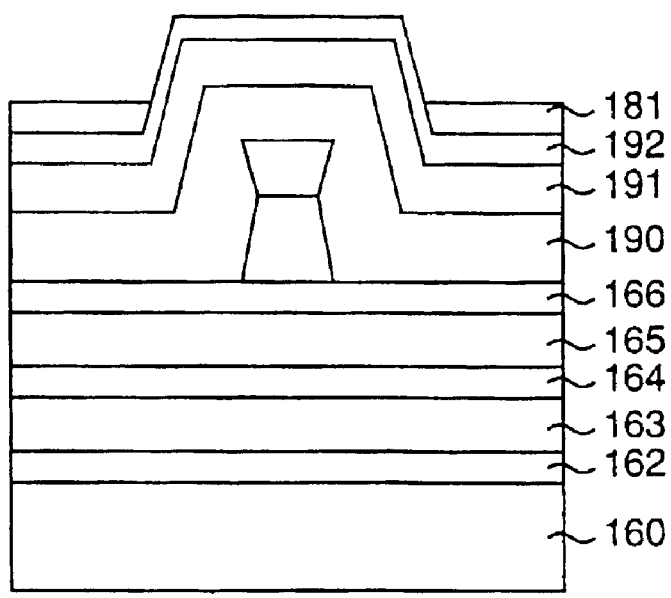

Next, as shown in FIG. 16, an n-Al$_x$Ga$_{1-x}$As current block layer (x=0.7, layer thickness: 1.0 μm, carrier concentration: $2\times10^{18}$ cm$^{-3}$) 190, an n-GaAs current block layer (layer thickness: 0.6 μm, carrier concentration: $2\times10^{18}$ cm$^{-3}$) 191 and a p-GaAs planarization layer (layer thickness: 0.4 μm, carrier concentration: $2\times10^{18}$ cm$^{-3}$) 192 were regrown by the MOCVD method.

Subsequently, photolithography was performed to form an etching mask 181 whose portion located above the current block layer portion (unnecessary layer portion) grown on the ridge had been removed in a stripe-like shape, as shown in FIG. 16. The unnecessary layer portion was removed by etching with a sulfuric acid-based etchant. Thereafter, a p-GaAs contact layer (not shown) was grown on the exposed wafer surface by the MOCVD method. The layer thickness of the contact layer was set to 50 μm.

The substrate surface of the wafer after completion of the regrowth up to the contact layer in the above process step was removed by abrasion or etching to make the wafer thickness 100 μm. Thereafter, the thus obtained wafer was formed with an electrode on each of its n-side and p-side surfaces. The wafer was cleaved into bar-like segments at the center of the end surface window regions 170 in a direction perpendicular to the ridge extending in a stripe-like shape inside the wafer, and opposite light-emitting surfaces were coated with an insulating film. In this way, a semiconductor laser device was completed.

Figure 11:
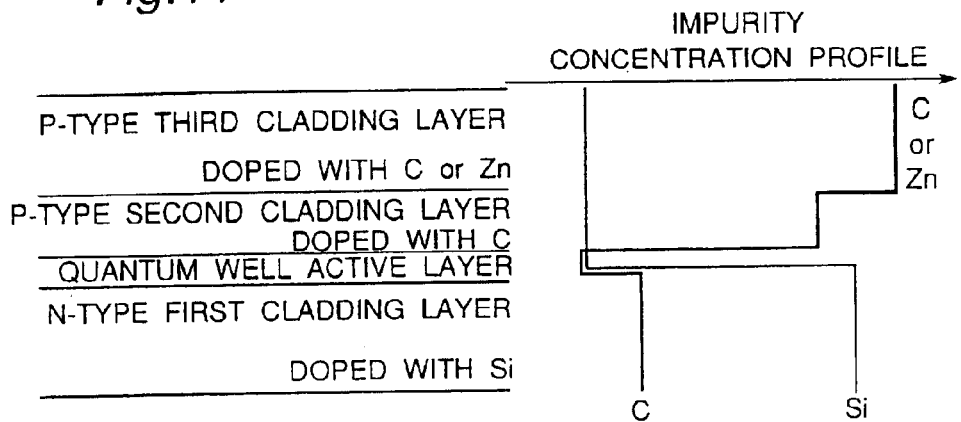
FIG. 11 shows a structure in cross-section and an impurity profile of a semiconductor laser device of the present invention.

The impurity concentration profile of this semiconductor laser device is shown in FIG. 11.

The semiconductor laser devices fabricated by this fabricating method had satisfactory and well-reproducible laser characteristics of, with the cavity length being 800 μm, an oscillation threshold value of 27 mA, a drive current of 95 mA at an optical output power of 90 mW, and an oscillation wavelength of 785 nm. With regard to an optical output limit due to the catastrophic optical damage (COD), a value as great as 250 mW was obtained.

For the sake of comparison, there were fabricated semiconductor laser devices having the same structure as the aforementioned one except for the use of a layer doped with Zn instead of C as an impurity for the p-AlGaAs second cladding layer. With the cavity length being 800 μm, these semiconductor laser devices had an oscillation threshold value of 30 to 35 mA, a drive current of 105 to 120 mA at an optical output of 90 mW, and an oscillation wavelength of 779 to 785 nm. As is obvious, the use of the p-AlGaAs layer doped with Zn invited degradation of laser characteristics and increased variations in the laser characteristics. In addition, the optical output limit was as small as 150 mW.

<Third Embodiment>

The semiconductor laser device fabricating method of the present embodiment differs from that of the second embodiment only in that the growth conditions of the p-AlGaAs third cladding layer 167 are changed. That is, in the second embodiment, the molar ratio of the group V source to the group III source (V/III ratio) was set to 60 and Zn was used as the p-type impurity. In the third embodiment, the molar ratio of the group V source to the group III source (V/III ratio) was set to 10, and C of the alkylated substances of TMG and TMA, or the sources of the group III elements of Ga and Al, was employed as a p-type impurity, similarly to the p-AlGaAs second cladding layer 165. In this case, the impurity concentration (C concentration) of the third cladding layer 167 was $2\times10^{18}$ cm$^{-3}$ as is apparent from FIG. 12.

The semiconductor laser devices fabricated by the fabricating method according to this embodiment had satisfactory and well-reproducible laser characteristics of, with the cavity length being 800 μm, an oscillation threshold value of 26 mA, a drive current of 90 mA at an optical output power of 90 mW, and an oscillation wavelength of 785 nm. With regard to the optical output limit due to the catastrophic optical damage, a value as great as 270 mW was obtained. Obviously, the semiconductor laser device of the third embodiment has characteristics superior to those of the semiconductor laser device of the second embodiment. This is presumably attributed to a reduction in impurity diffusion from the p-AlGaAs third cladding layer 167 depending on the layer growth conditions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising an n-type first cladding layer, an active layer, and a p-type second cladding layer stacked on or above an n-type semiconductor substrate, wherein the second cladding layer contains carbon as a p-type impurity at a concentration of $2 \times 10^{17}$ cm$^{-3}$ to $2 \times 10^{18}$ cm$^{-3}$;

wherein the active layer comprises at least one quantum well layer, and the semiconductor laser device further comprises a ridge-shaped p-type third cladding layer and an n-type current block layer which are provided on or above the second cladding layer in a manner that the third cladding layer extends in a stripe-like shape and that the n-type current block layer holds the third cladding layer from laterally opposite sides thereof; and wherein the third cladding layer contains carbon as a p-type impurity at a concentration of $2 \times 10^{17}$ cm$^{-3}$ or higher and wherein carbon concentration of the third cladding layer is different than the carbon concentration of the second cladding layer.

2. The semiconductor laser device as claimed in claim 1, wherein the active layer has a disordered window region at a light-emitting end surface portion thereof, said active layer having a greater band gap in the window region than in an oscillation region.

3. The semiconductor laser device of claim 1, carbon concentration of the third cladding layer is larger than the carbon concentration of the second cladding layer.

* * * * *